(12) United States Patent
Chen et al.

(10) Patent No.: US 9,753,316 B2
(45) Date of Patent: Sep. 5, 2017

(54) SUPPORTING BASE AND DISPLAY DEVICE EMPLOYING THE SAME

(71) Applicant: AU OPTRONICS CORP., Hsin-Chu (TW)

(72) Inventors: Nan-Jui Chen, Hsin-Chu (TW);
Yun-Wei Tsai, Hsin-Chu (TW);
Wen-Hung Huang, Hsin-Chu (TW);
Chih-Liang Pan, Hsin-Chu (TW);
Ming-Sheng Lai, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 70 days.

(21) Appl. No.: 14/923,725

(22) Filed: Oct. 27, 2015

(65) Prior Publication Data
US 2016/0048051 A1  Feb. 18, 2016

Related U.S. Application Data

(62) Division of application No. 13/426,797, filed on Mar. 22, 2012, now Pat. No. 9,204,563.

(30) Foreign Application Priority Data

Jul. 1, 2011  (TW) .............................. 100123359 A
Oct. 24, 2011  (TW) .............................. 100138540 A

(51) Int. Cl.
*G02F 1/1333* (2006.01)
*H05K 5/02* (2006.01)
(Continued)

(52) U.S. Cl.
CPC ........ *G02F 1/133308* (2013.01); *A47B 81/06* (2013.01); *H05K 5/0017* (2013.01);
(Continued)

(58) Field of Classification Search
CPC ... G02F 1/133308; G02F 2001/133314; G02F 2001/133317; G02F 2001/13332; H05K 5/02; H05K 5/0017; A47B 81/06
See application file for complete search history.

(56) References Cited

U.S. PATENT DOCUMENTS 6,862,053 B2  3/2005  Lee et al.
2003/0122994 A1  7/2003  Chen et al.
(Continued)

FOREIGN PATENT DOCUMENTS

CN  101226294  7/2008
CN  102096218 A  6/2011
(Continued)

OTHER PUBLICATIONS

China Patent Office, "Office Action", Feb. 12, 2014.
Taiwan Patent Office, "Office Action", Jun. 17, 2014.

*Primary Examiner* — Nathanael R Briggs
(74) *Attorney, Agent, or Firm* — WPAT, PC

(57) ABSTRACT

A supporting base includes a bottom plate and a plurality of stepwise supporting structures connected with and raised up from a plurality of side edges of the bottom plate. Each stepwise supporting structure includes a plurality of raising segments and at least one supporting segment. The plurality of raising segments and the at least one supporting segment are alternately arranged. The at least one supporting segment is substantially parallel to the bottom plate. The lowest raising segment has a bottom end connected with one of the side edges of the bottom plate. A thickness of at least one of the at least one supporting segment is greater than that of at least one of the plurality of raising segments. A display device using the support base is also provided to improve assembling efficiency and reduce cost.

21 Claims, 8 Drawing Sheets

(51) Int. Cl.
  *A47B 81/06*  (2006.01)
  *H05K 5/00*  (2006.01)
(52) U.S. Cl.
  CPC ..... *H05K 5/02* (2013.01); *G02F 2001/13332* (2013.01); *G02F 2001/133314* (2013.01); *G02F 2001/133317* (2013.01)

(56) References Cited

U.S. PATENT DOCUMENTS

| | | |
|---|---|---|
| 2004/0246397 A1 | 12/2004 | Kang et al. |
| 2007/0008449 A1 | 1/2007 | Choi |
| 2011/0134366 A1 | 6/2011 | Pan et al. |
| 2011/0255026 A1 | 10/2011 | Pan et al. |
| 2012/0140139 A1 | 6/2012 | Zhang et al. |

FOREIGN PATENT DOCUMENTS

| | | |
|---|---|---|
| JP | 2001-168546 A | 6/2001 |
| JP | 2007157500 | 6/2007 |
| JP | 2009076456 | 4/2009 |
| TW | 437977 | 5/2001 |
| TW | I229224 | 3/2005 |
| TW | 200639503 A | 5/2005 |
| TW | I256499 | 6/2006 |
| TW | I263468 | 10/2006 |
| TW | I289227 | 11/2007 |
| TW | 200811531 | 3/2008 |
| TW | M329791 | 4/2008 |

SUPPORTING BASE AND DISPLAY DEVICE EMPLOYING THE SAME

This application is a division of and claims priority to U.S. patent application Ser. No. 13/426,797, filed Mar. 22, 2012, the disclosure of which is incorporated in its entirely herein by reference thereto.

TECHNICAL FIELD

The present invention relates to a supporting base, and more particularly to a supporting base having stepwise supporting structures and a display device employing the same.

BACKGROUND

With the technical progress of flat panel display technology, flat panel display devices are popular due to the advantages of light weigh, small volume and energy-saving. The flat panel display devices are divided into various types, such as liquid crystal display devices, plasma display devices, organic light emitting diode display devices, and electrophoretic display devices. Among these types, the liquid crystal display devices are the most popular type.

FIG. 1 is a schematic, partially cross-sectional view of a conventional liquid crystal display device. Referring to FIG. 1, the liquid crystal display device 100 includes a liquid crystal display panel 110 and a backlight module 120. The backlight module 120 includes a light guide plate 122, a plurality of optical films 124 disposed on a front side of the light guide plate 122, and a reflector 126 disposed on a back side of the light guide plate 122. The reflector 126, the light guide plate 122 and the optical films 124 are disposed on a back bezel 130. The liquid crystal display device 100 further includes an inner frame 140 and a front frame 150. The inner frame 140 is made of plastic material and formed with a protrusion 142 extending into a position in front of the light guide plate 122. The liquid crystal display panel 110 is disposed on the protrusion 142. The front frame 150 and the back bezel 130 are coupled to each other so as to wrap the liquid crystal display panel 110 and the backlight module 120.

However, in the conventional liquid crystal display device 100, two separate components, i.e., the back bezel 130 and the inner frame 140, are required to respectively bear the backlight module 120 and the liquid crystal display panel 110. An assembling process of the liquid crystal display device 100 is thus complicated, resulting in inefficiency in assembly and high manufacturing cost.

SUMMARY

The present invention provides a supporting base for a display device to reduce a number of elements of the display device, thereby improving assembling efficiency and reducing cost.

The present invention provides a display device to improve assembling efficiency and reduce cost.

The present invention in one aspect provides a supporting base applicable to a display device. The supporting base includes a bottom plate and a plurality of stepwise supporting structures. The bottom plate has a plurality of side edges, and the stepwise supporting structures are respectively connected with the side edges and raised up from the bottom plate. Each stepwise supporting structure includes a plurality of raising segments and at least one supporting segment. The plurality of raising segments and the at least one supporting segment are alternately arranged. The at least one supporting segment is substantially parallel to the bottom plate. The lowest raising segment has a bottom end connected with one of the side edges of the bottom plate, and a thickness of at least one of the at least one supporting segment is greater than that of at least one of the plurality of raising segments.

The present invention in another aspect provides a display device. The display device includes the above-mentioned supporting base, a light guide plate and a display panel. The light guide plate is disposed on the bottom plate of the supporting base. The display panel is disposed on the corresponding supporting segment of each of the stepwise supporting structures.

The present invention in another aspect provides a supporting base applicable to a display device. The supporting base includes a bottom plate and a plurality of stepwise supporting structures. The bottom plate has a plurality of side edges, and the stepwise supporting structures are respectively connected with the side edges and raised up from the bottom plate. Each stepwise supporting structure includes a plurality of raising segments and at least one supporting segment. The plurality of raising segments and the at least one supporting segment are alternately arranged, and the at least one supporting segment is substantially parallel to the bottom plate. The lowest raising segment has a bottom end connected with one of the side edges of the bottom plate, the bottom plate and the stepwise supporting structures are made of a light reflective material. A thickness of the light reflective material is in positive correlation to a reflectivity of the light reflective material, and the reflectivity of at least one of the at least one supporting segment is greater than the reflectivity of at least one of the plurality of raising segments. In another embodiment, the reflectivity of at least one of the at least one supporting segment may be equal to the reflectivity of at least one of the plurality of raising segments.

The present invention in another aspect provides a supporting base applicable to a display device. The supporting base includes a bottom plate and a plurality of stepwise supporting structures. The bottom plate has a plurality of side edges, and the stepwise supporting structures are respectively connected with the side edges and raised up from the bottom plate. Each stepwise supporting structure includes a first raising segment, a first supporting segment, and a second raising segment. The first raising segment has a bottom end connected with one of the side edges of the bottom plate. The first supporting segment is substantially parallel to the bottom plate and extends outwards of the bottom plate from a top end of the first raising segment. The first supporting segment has an inner end connected with the top end of the first raising segment. The second raising segment is raised up from the first supporting segment and has a bottom end connected with an outer end of the supporting segment far away from the first raising segment. If a thickness of the bottom plate is represented by D1, a thickness of the first supporting segment is represented by D2, a thickness of the first raising segment is represented by E1, and a thickness of the second raising segment is represented by E2, then the relationship between D1, D2, E1 and E2 is limited by E1<D1, E1<D2, and E2<D2.

The present invention in another aspect provides a display device. The display device includes a supporting base, a light guide plate and a display panel. The supporting base includes a bottom plate and a plurality of stepwise supporting structures. The bottom plate has a plurality of side edges, and the stepwise supporting structures are respectively connected with the side edges and raised up from the bottom plate. Each stepwise supporting structure includes a first raising segment, a first supporting segment, and a second raising segment. The first raising segment has a bottom end connected with one of the side edges of the bottom plate. The first supporting segment is substantially parallel to the bottom plate and extends outwards of the bottom plate from a top end of the first raising segment. The first supporting segment has an inner end connected with the top end of the first raising segment. The second raising segment is raised up from the first supporting segment and has a bottom end connected with an outer end of the supporting segment far away from the first raising segment. If a thickness of the bottom plate is represented by D1, a thickness of the first supporting segment is represented by D2, a thickness of the first raising segment is represented by E1, and a thickness of the second raising segment is represented by E2, then the relationship between D1, D2, E1 and E2 is limited by $E1<D1$, $E1<D2$, and $E2<D2$. The light guide plate is disposed on the bottom plate. The display panel is disposed above the light guide plate.

The present invention in another aspect provides a supporting base applicable to a display device. The supporting base includes a bottom plate and a plurality of stepwise supporting structures. The bottom plate has a plurality of side edges, and the stepwise supporting structures are respectively connected with the side edges and raised up from the bottom plate. Each stepwise supporting structure includes a first raising segment, a first supporting segment, and a second raising segment. The first raising segment has a bottom end connected with one of the side edges of the bottom plate. The first supporting segment is substantially parallel to the bottom plate and extends outwards of the bottom plate from a top end of the first raising segment. The first supporting segment has an inner end connected with the top end of the first raising segment. The second raising segment is raised up from the first supporting segment and has a bottom end connected with an outer end of the first supporting segment far away from the first raising segment. If the reflectivity of the bottom plate is represented by R1, the reflectivity of the first supporting segment is represented by R2, the reflectivity of the first raising segment is represented by S1 and the reflectivity of the second raising segment is represented by S2, then the relationship between R1, R2, S1 and S2 is limited by $S1<R1$, $S1<R2$, and $S2<R2$.

The present invention in another aspect provides a display device. The display device includes a supporting base, a light guide plate, a display panel, and a bottom cover. The supporting base includes a bottom plate and a plurality of stepwise supporting structures. The bottom plate has a plurality of side edges, and the stepwise supporting structures are respectively connected with the side edges and raised up from the bottom plate. Each stepwise supporting structure includes a plurality of raising segments and at least one supporting segment, and the plurality of raising segments and the at least one supporting segment are alternately arranged. The at least one supporting segment is substantially parallel to the bottom plate. The lowest raising segment has a bottom end connected with one of the side edges of the bottom plate. The light guide plate is disposed on the bottom plate. The display panel is disposed on the corresponding supporting segment of each of stepwise supporting structures. The supporting base is disposed on the bottom cover, a bottom of the bottom cover has at least one locating post, the at least one supporting segment of at least some of the stepwise supporting structures is defined with at least one locating hole corresponding to the at least one locating post, and the at least one locating post is inserted into the at least one locating hole.

The present invention in another aspect provides a display device. The display device includes a supporting base, a light guide plate, and a display panel. The supporting base includes a bottom plate and a plurality of stepwise supporting structures. The bottom plate has a plurality of side edges, and the stepwise supporting structures are respectively connected with the side edges and raised up from the bottom plate. Each stepwise supporting structure includes a plurality of raising segments and at least one supporting segment. The plurality of raising segments and the at least one supporting segment are alternately arranged. The at least one supporting segment is substantially parallel to the bottom plate. The lowest raising segment has a bottom end connected with one of the side edges of the bottom plate. At least one of the lowest raising segments of the stepwise supporting structures is defined with a first groove. The light guide plate is disposed on the bottom plate and inserted into the first groove. The display panel is disposed on the corresponding supporting segment of each of the stepwise supporting structures.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
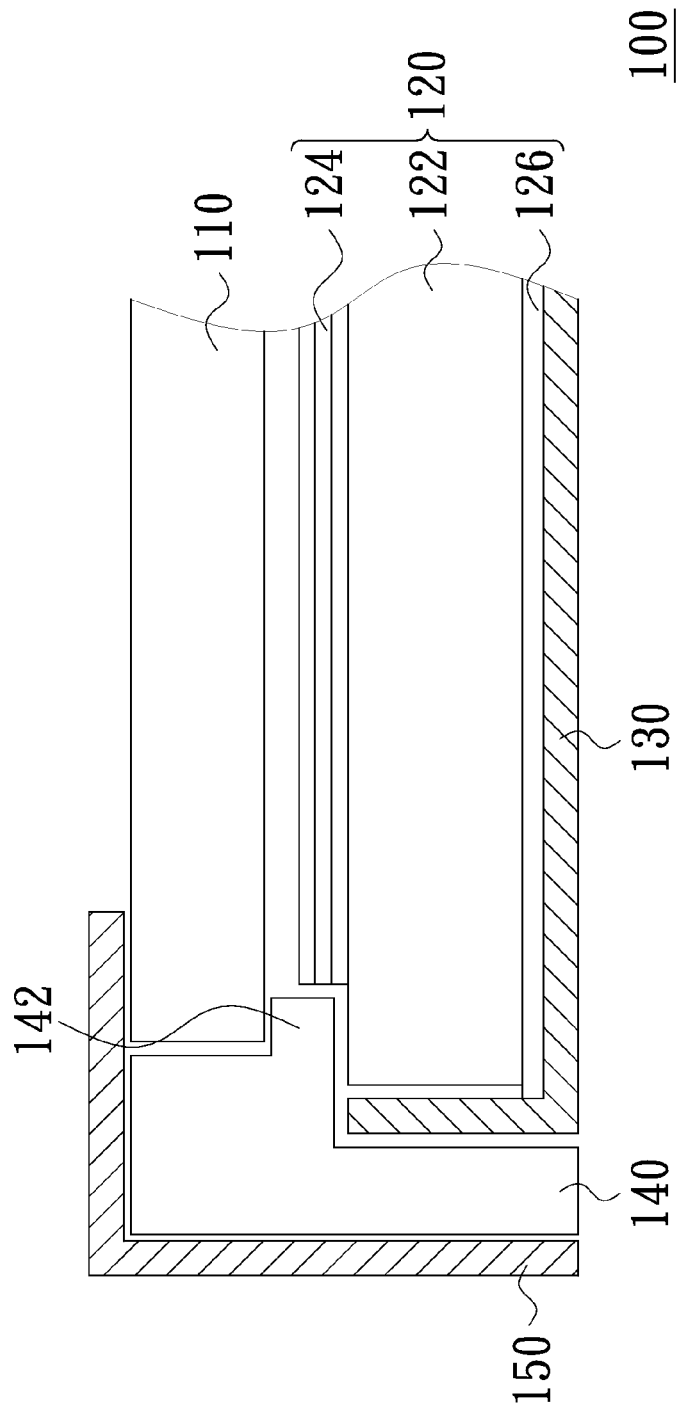
FIG. 1 is a schematic, partially cross-sectional view of a liquid crystal display device according to related art.
Figure 2A:
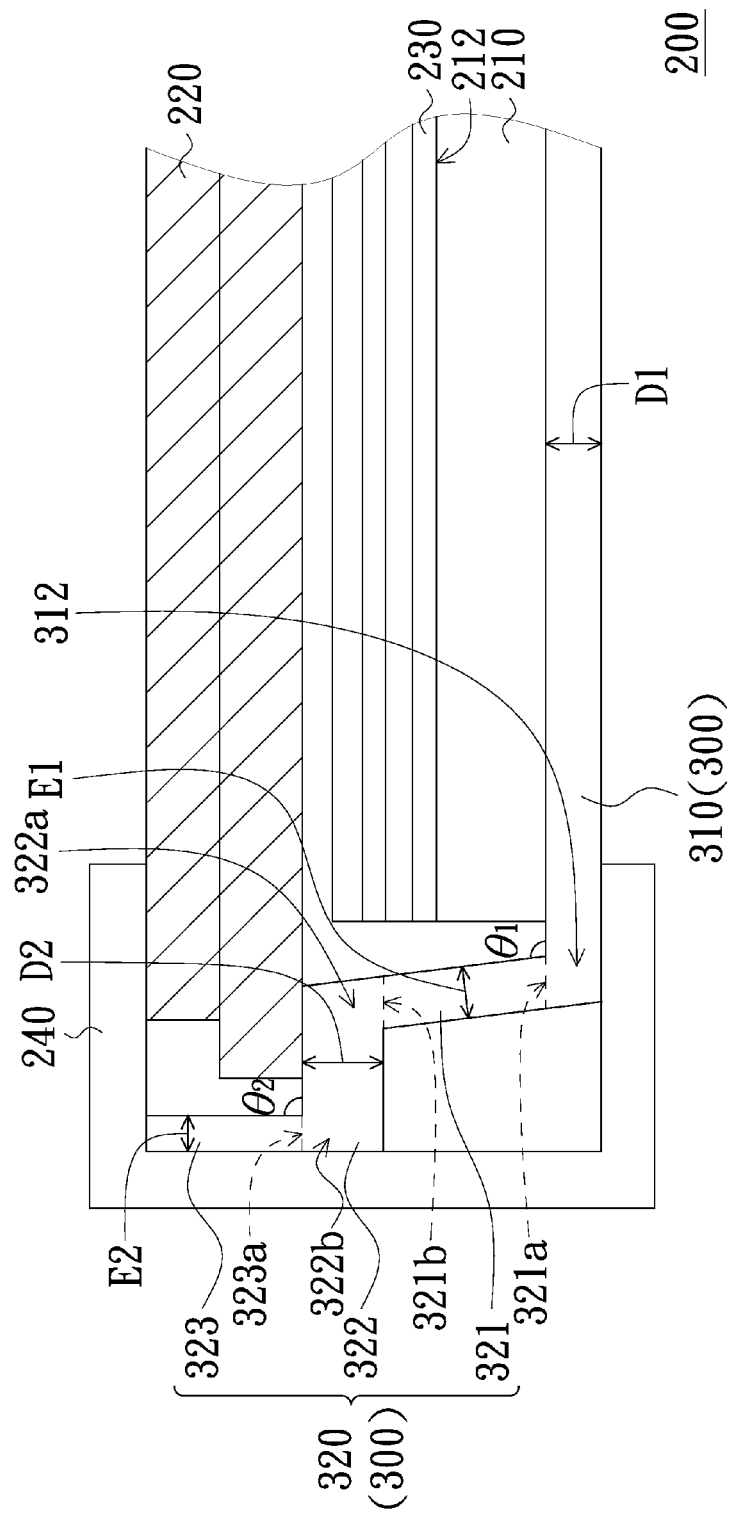
FIG. 2A and FIG. 2B are schematic, partially cross-sectional views of a display device according to a first embodiment of the present invention.
Figure 2B:
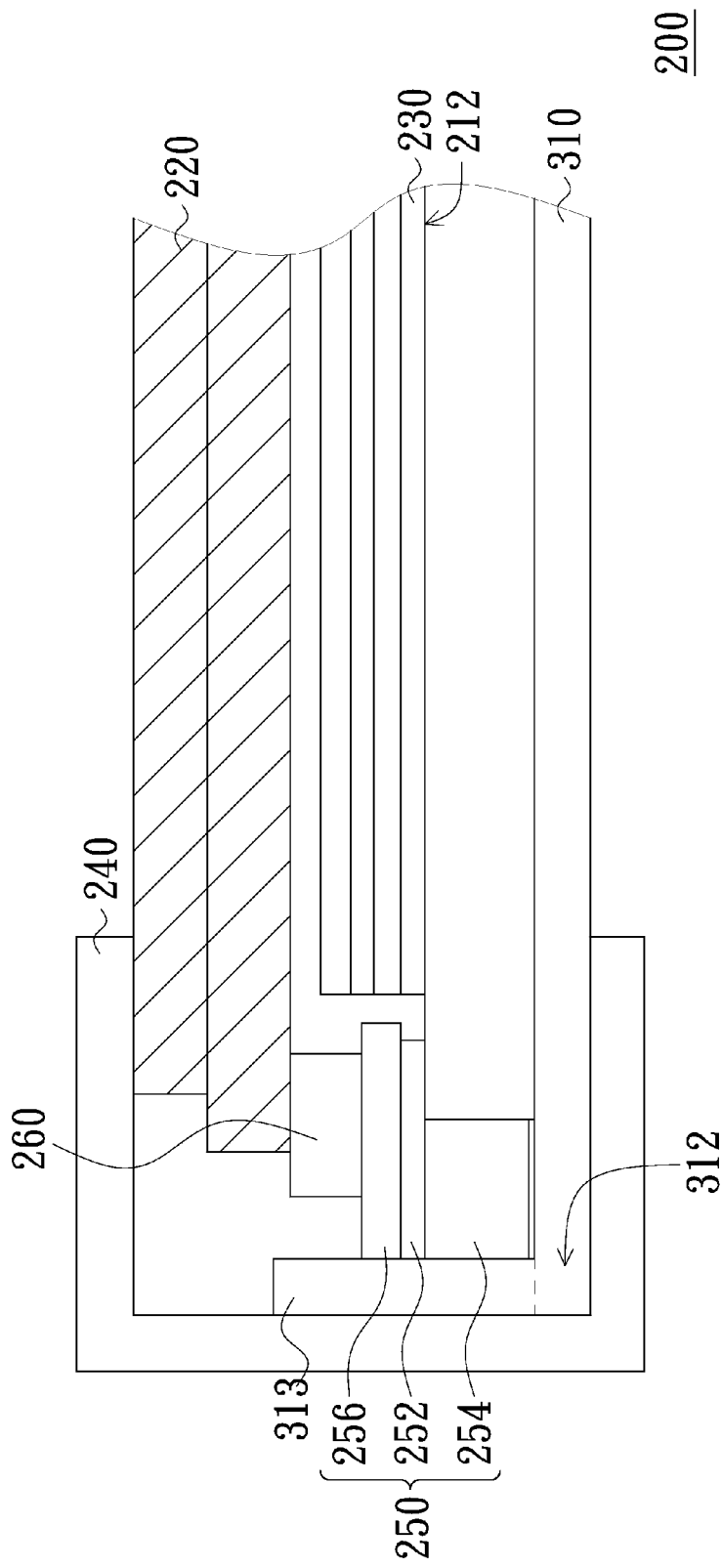

FIG. 2A and FIG. 2B are schematic, partially cross-sectional views of a display device according to a first embodiment of the present invention. Referring to FIG. 2A, the display device 200 includes a light guide plate 210, a display panel 220 and a supporting base 300. The light guide plate 210 and the display panel 220 are supported on the supporting base 300. The supporting base 300 includes a bottom plate 310 and a plurality of stepwise supporting structures 320 formed on the bottom plate 310, wherein only one supporting structure 320 is shown in FIG. 2A. The bottom plate 310 can have different shapes according to practical use, such as circular or polygonal. In the first embodiment, the shape of the bottom plate 310 is polygonal such as rectangular, and accordingly the bottom plate 310 has a plurality of side edges 312. The stepwise supporting structures 320 are formed on the side edges 312. Each stepwise supporting structure 320 is connected with a corresponding one of the side edges 312 and raised up from the bottom plate 310 along a direction far away from a region right above the bottom plate 310. In the illustrated first embodiment, the stepwise supporting structures 320 can be formed on some of the side edges 312. In other words, it is not necessary to form the stepwise supporting structure 320 on each and every side edge 312. Furthermore, each side edge 312 can be connected with only one or more than one stepwise supporting structure 320. When more than one stepwise supporting structure 320 is formed on a single side edge 312, the stepwise supporting structures 320 on the single side edge 312 can be connected together or spaced from each other with a gap formed between the stepwise supporting structures 320.

Each stepwise supporting structure 320 includes a plurality of raising segments and at least one supporting segment. The raising segments and the at least one supporting segment are alternately arranged. In the illustrated first embodiment, each stepwise supporting structure 320 includes a raising segment 321, a supporting segment 322, and a raising segment 323. The lowest raising segment (i.e. the raising segment 321) is raised up from the corresponding side edge 312 of the bottom plate 310 along a direction far away from the bottom plate 310 and has a bottom end 321a connected with the corresponding side edge 312. The supporting segment 322 is located and connected between the raising segment 321 and the raising segment 323. The supporting segment 322 is substantially parallel to the bottom plate 310 and extends outwards of the bottom plate 310 from a top end 321b of the raising segment 321. The supporting segment 322 has an inner end 322a connected with the top end 321b of the raising segment 321. The raising segment 323 is raised up from the supporting segment 322 and has a bottom end 323a connected with an outer end 322b of the supporting segment 322 far away from the raising segment 321. The light guide plate 210 is disposed on the bottom plate 310 of the supporting base 300. The display panel 220 is supported on the corresponding supporting segments 322 of the stepwise supporting structures 320.

The display panel 220, for example, can be a liquid crystal display panel or other non-self-luminous display panel. The display device 200 can further include at least an optical film 230, and in FIG. 2A, a plurality of optical films 230 are provided and shown. These optical films 230, for example, are disposed on a light-emitting surface 212 of the light guide plate 210. The optical films 230 can be diffusion films, brightness enhancement films, and other films that can adjust light path so as to improve brightness and uniformity of light. Furthermore, as shown in FIG. 2B, the display device 200 can further include a light source 250, and the light source 250 is disposed on the bottom plate 310 for providing lights into the light guide plate 210. Specifically, the light source 250 is disposed adjacent to one of the side edges 312 of the bottom plate 310. The side edge 312 disposed with the light source 250 is, for example, connected with a sidewall 313 instead of being connected with the stepwise supporting structure 320, and the light source 250 may abut against the sidewall 313. In the illustrated first embodiment, the light source 250 includes, for example, a circuit board 252, a plurality of point light sources 254 and a substrate 256. The circuit board 252 is fixed to the substrate 256. The point light sources 254 are mounted on and electrically connected to the circuit board 252. The point light sources 254 can be light emitting diodes or other suitable point light sources. The substrate 256 can be used for dissipating heat or preventing electrostatic discharge. Furthermore, a buffering element 260 can be disposed on the substrate 256, and the display panel 220 is supported on the buffering element 260. The buffering element 260 can be a rubber pad or an adhesive tape.

The display device 200 can further include a fixing element 240 for fixing and holding the bottom plate 310, the light guide plate 210, and the display panel 220 together. The fixing element 240 wraps a peripheral region of the display panel 210, an outer side of each stepwise supporting structure 320 far away from the display panel 210 and a peripheral region of bottom plate 310, whereby the display panel 220, the optical films 230, the light guide plate 210 and the light source 250 are fixedly held on the supporting base 300. The fixing element 240 can be made of a light shading material to provide a light shading effect. For example, the fixing element 240 can be made of plastic or metal, wherein the fixing element 240 made of plastic may be adhesive tape.

In the illustrated first embodiment, the bottom plate 310 and the stepwise supporting structures 320 are, for example, integrally formed from a monolithic material. Therefore, a thickness of the supporting segment 322 is substantially equal to a thickness of each of the raising segments 321, 323. A thickness of the bottom plate 310 is also substantially equal to the thickness of each of the raising segments 321, 323.

In order to enhance a structural strength of the supporting base 300, to cause a juncture of the raising segment 321 (or 323) and the supporting segment 322 to have a satisfactory bending angle, and to cause the supporting segment 322 to have a satisfactory flatness, the thickness of the supporting segment 322 can be greater than the thickness of each of the raising segments 321, 323 and the thickness of the bottom plate 310 can be greater than the thickness of each of the raising segments 321, 323. If the thickness of each of the bottom plate 310 and the supporting segment 322 is represented by D and the thickness of each of the raising segments 321, 323 is represented by E, then in an embodiment, the relationship between D and E is satisfied by $0.3 \leq E/D < 1$.

It is pointed out that the thickness of the bottom plate 310 and the thickness of the supporting segment 322 can be equal to or different from each other, and the thickness of the raising segment 321 and the thickness of the raising segment 323 can also be equal to or different from each other. Therefore, the ration of the thicknesses of the raising segment and its connected bottom plate or raising segment can be respectively limited. For example, if the thickness of the raising segment 321 is represented by E1, the thickness of the raising segment 323 is represented by E2, the thickness of the bottom plate 310 is represented by D1, and the thickness of the supporting segment 322 is represented by D2, then the relationship between E1, E2, D1, and D2 can be satisfied by $E1<D1$, $E1<D2$, $E2<D2$. In an embodiment, the relationship between E1, E2, D1, and D2 can be further limited by $0.3 \leq E1/D1 < 1$, $0.3 \leq E1/D2 < 1$, $0.3 \leq E2/D2 < 1$, to cause each stepwise supporting structure 320 to have a satisfactory structural strength and a satisfactory bending angle, and to cause the supporting segment 322 to have a satisfactory flatness and a satisfactory supporting strength.

The bottom plate 310 and the stepwise supporting structures 320 can be made of a light reflective material such that a reflector is no longer required to interpose between the light guide plate 210 and the bottom plate 310. The light reflective material for the bottom plate 310 and the stepwise supporting structures 320 can be plastic or metal. For example, the light reflective material can be white foamed polyethylene glycol terephthalate. In other words, the bottom plate 310 and the stepwise supporting structures 320 can be made by processing a white foamed polyethylene terephthalate sheet to cause the bottom plate 310 and the stepwise supporting structures 320 to have a light reflective effect. A thickness of the selected light reflective material can be in positive correlation to a reflectivity of the selected light reflective material. In the embodiment wherein the thickness of the supporting segment 322 is substantially equal to the thickness of each of the raising segments 321, 323, a reflectivity of the supporting segment 322 is substantially equal to a reflectivity of each of the raising segments 321, 323. In the embodiment wherein the thickness of the bottom plate 310 is substantially equal to the thickness of each of the raising segments 321, 323, a reflectivity of the bottom plate 310 is substantially equal to a reflectivity of each of the raising segments 321, 323. Further, in the embodiment wherein the thickness of the supporting segment 322 is greater than the thickness of each of the raising segments 321, 323, a reflectivity of the supporting segment 322 is greater than a reflectivity of each of the raising segments 321, 323. In the embodiment wherein the thickness of the bottom plate 310 is greater than the thickness of each of the raising segments 321, 323, a reflectivity of the bottom plate 310 is greater than a reflectivity of each of the raising segments 321, 323. If the reflectivity of the bottom plate 310 or the supporting segment 322 is represented by R and the reflectivity of each of the raising segments 321, 323 is represented by S, then in an embodiment, the relationship between R and S is satisfied by $0.8 \leq S/R < 1$, to cause each stepwise supporting structure 320 to have a satisfactory structural strength and a satisfactory bending angle, and to cause the supporting segment 322 to have a satisfactory flatness and a satisfactory supporting strength. Furthermore, the ration of the reflectivities of the raising segment and its connected bottom plate or raising segment can be respectively limited. For example, if the reflectivity of the bottom plate 310 is represented by R1, the reflectivity of the supporting segment 322 is represented by R2, the reflectivity of the raising segment 321 is represented by S1, and the reflectivity of the raising segment 323 is represented by S2, then the relationship between R1, R2, S1, and S2 can be satisfied by S1<R1, S1<R2, S2<R2, to cause each stepwise supporting structure 320 to have a satisfactory structural strength and a satisfactory bending angle, and to cause the supporting segment 322 to have a satisfactory flatness and a satisfactory supporting strength. In an embodiment, the relationship between R1, R2, S1, and S2 can be further limited by $0.8 \leq S1/R1 < 1$, $0.8 \leq S1/R2 < 1$, $0.8 \leq S2/R2 < 1$.

In the illustrated first embodiment, an included angle between each raising segment and its connected bottom plate or supporting element may be in a range from 45 degrees to 135 degrees. That, is the included angle $\theta_1$ between the raising segment 321 and the bottom plate 310 may be in the range of 45 degrees to 135 degrees, and the included angle $\theta_2$ between the raising segment 323 and the supporting segment 322 may be in the range of 45 degrees to 135 degrees. In the illustrated first embodiment, because the fixing element 240 is directly attached to an outer side of the raising segment 323 far away from the display panel 220, the included angle $\theta_2$ between the raising segment 323 and the supporting segment 322 can be 90 degrees, such that the fixing element 240 can directly abut against the outer side of the raising segment 323 to enhance a fixing effect of the fixing element 240. For example, if an adhesive tape is provided as the fixing element 240, the adhesive tape can be adhered to the top surface and the outer side of the raising segment 323 due to the included angle $\theta_2$ being 90 degrees, whereby a fixing effect is enhanced. In addition, when the included angle $\theta_1$ between the bottom plate 310 and the raising segment 321 is smaller than 90 degrees, the raising segment 321 can prevent light leakage when the light is transmitted from the light guide plate 210 to the display panel 220.

In the illustrated display device 200, since the supporting base 300 can carry the light guide plate 210, the optical films 230, the light source 250 and the display panel 220 thereon, the supporting base 300 can replace for the back bezel and the inner frame as required by conventional display devices. Because the back bezel and the inner frame required by conventional display devices are replaced by the supporting base 300, the display device 200 is simplified with reduced components and an assembling efficiency thereof is accordingly improved. Furthermore, the supporting base 300 can be made of the light reflective material such that the reflector is no longer required between the light guide plate 210 and the supporting base 300, thereby reducing a manufacturing cost for the display device 200 and further improving the assembling efficiency for the display device 200.

Figure 3:
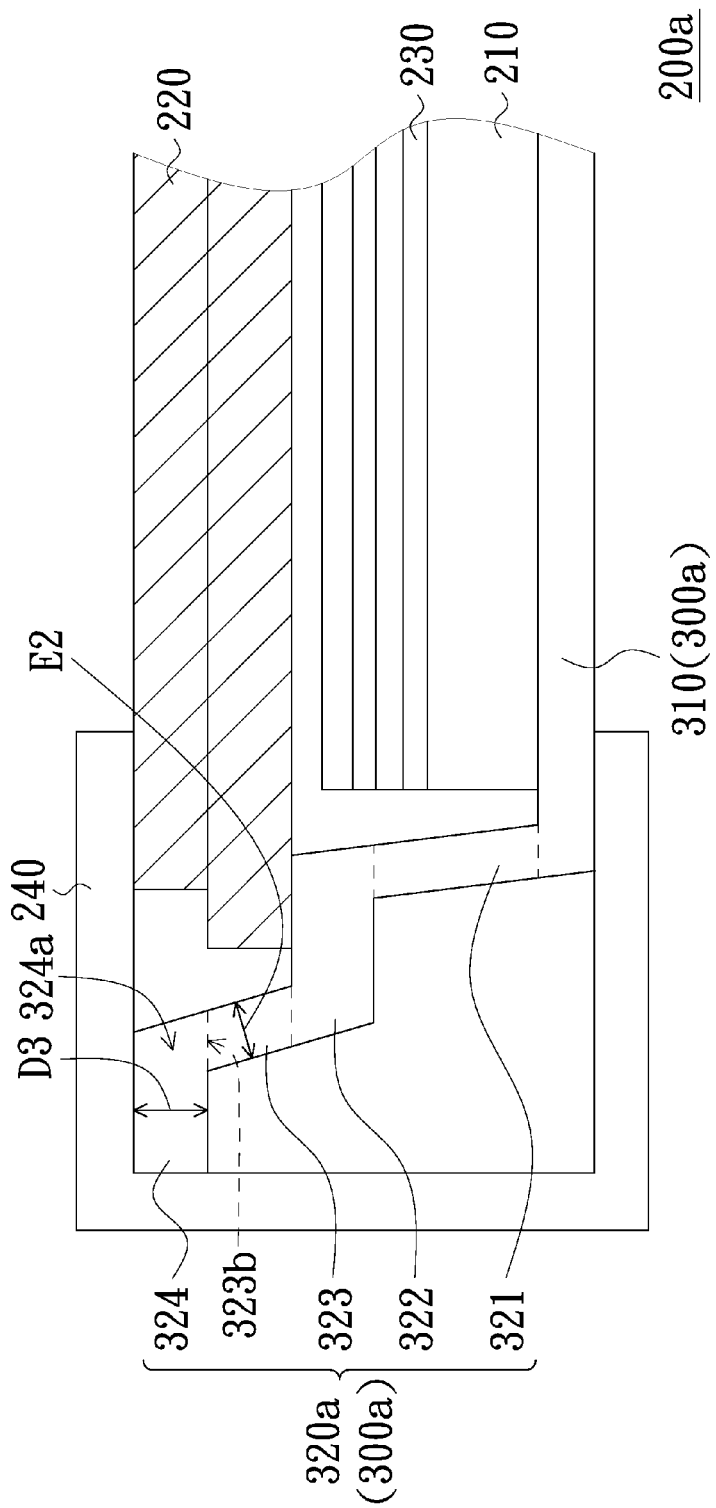
FIG. 3 is a schematic, partially cross-sectional view of a display device according to a second embodiment of the present invention.

FIG. 3 is a schematic, partially cross-sectional view of a display device 200a according to a second embodiment of the present invention. Referring to FIG. 3, the display device 200a is similar to the above-mentioned display device 200, and for clarity, only the difference of the display device 200a over the display device 200 is described hereinafter. In contrast to the stepwise supporting structure 320 of FIG. 2A, the stepwise supporting structure 320a of the supporting base 300a in FIG. 3 further includes a supporting segment 324. The supporting segment 324 is substantially parallel to the bottom plate 310 and extends outwards of the bottom plate 310 from a top end 323b of the raising segment 323. The supporting segment 324 has an inner end 324a connected to the top end 323b of the raising segment 323. The fixing element 240 is attached to the supporting segment 324. If a thickness of the supporting segment 324 is represented by D3, then the relationship between D3 and E2 is satisfied by E2<D3. In an embodiment, in order to cause a juncture of the supporting segment 324 and the raising segment 323 to have a satisfactory bending angle and a satisfactory structural strength, and to cause the supporting segment 324 to have a satisfactory flatness, the relationship between D3 and E2 can be further limited by $0.3 \leq E2/D3 < 1$. In addition, if the reflectivity of the supporting segment 324 is represented by R3, then the relationship between R3 and S2 is satisfied by S2<R3. In an embodiment, the relationship between R3 and S2 can be further limited by $0.8 \leq S2/R3 < 1$ to cause the juncture between the supporting segment 324 and the raising segment 323 to have a satisfactory structural strength and a satisfactory bending angle, and to cause the supporting segment 324 to have a satisfactory flatness.

In the illustrated first embodiment of FIG. 2A, the raising segment 323 is set perpendicular to the supporting segment 322 so as to enhance a fixing effect of the fixing element 240. However, in the illustrated second embodiment of FIG. 3, the supporting segment 324 is provided to increase a contact surface area between the fixing element 240 and the stepwise supporting structure 320a, thereby enhancing a fixing effect of the fixing element 240. Therefore, in the second embodiment, a satisfactory fixing effect of the fixing element 240 can be obtained even if an included angle between the raising segment 323 and the supporting segment 322 is set at an angle other than 90 degrees.

Figure 4:
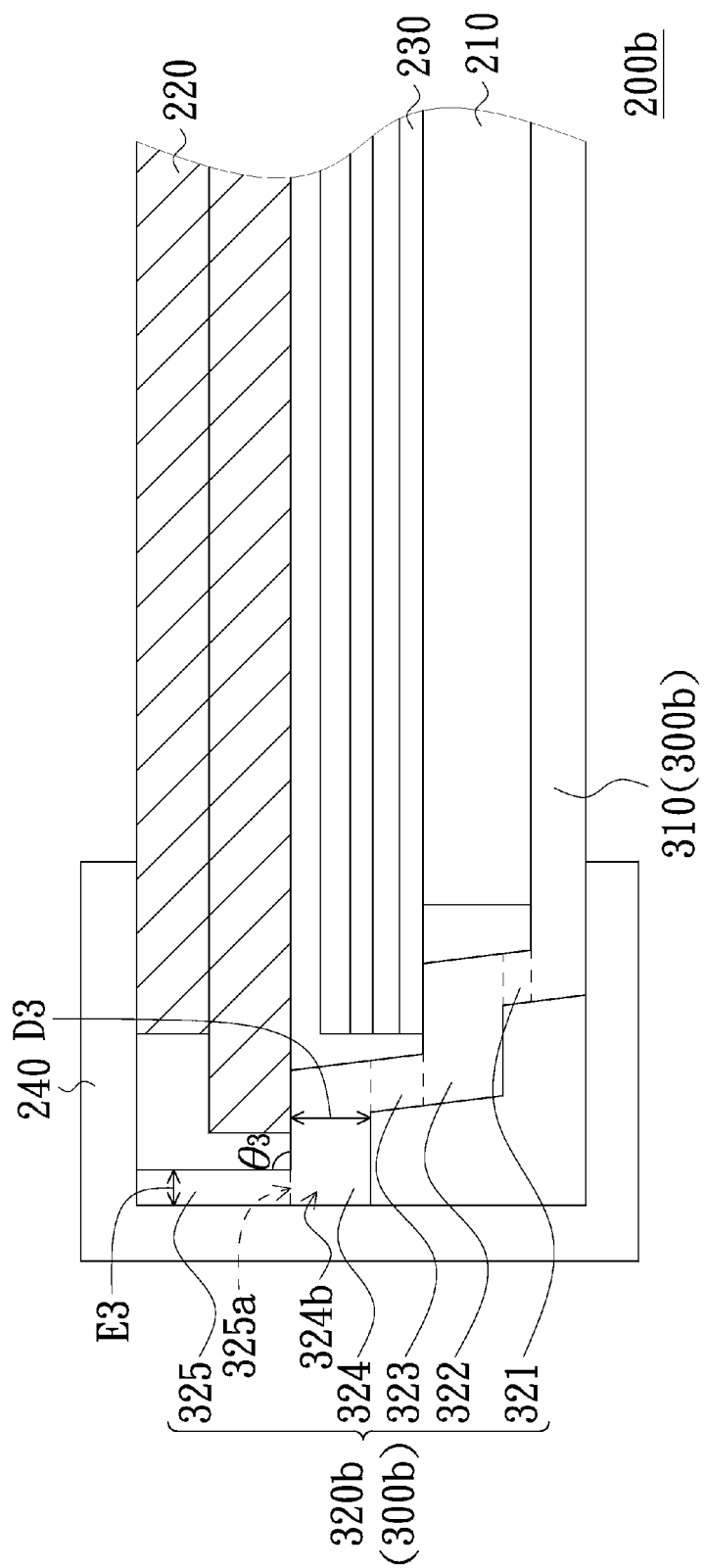
FIG. 4 is a schematic, partially cross-sectional view of a display device according to a third embodiment of the present invention.

FIG. 4 is a schematic, partially cross-sectional view of a display device 200b according to a third embodiment of the present invention. Referring to FIG. 4, the display device 200b is similar to the above-mentioned display device 200a, and for clarity, only the difference of the display device 200b over the display device 200a is described hereinafter. In contrast to the stepwise supporting structure 320a of FIG. 3, the stepwise supporting structure 320b of the supporting base 300b in FIG. 4 further includes a raising segment 325. The raising segment 325 is raised up from the supporting segment 324 and has a bottom end 325a connected to an outer end 324b of the supporting segment 324 far away from the raising segment 323. An included angle $\theta_3$ between the raising segment 325 and the supporting segment 324 may be in the range of 45 degrees to 135 degrees. The optical films 230 are disposed on the supporting segment 322, and the display panel 220 is disposed on the supporting segment 324.

If a thickness of the raising segment 325 is represented by E3, then the relationship between E3 and D3 is, for example, satisfied by E3<D3. In an embodiment, in order to cause a juncture between the supporting segment 324 and the raising segment 325 to have a satisfactory structural strength and a satisfactory bending angle, the relationship between E3 and D3 can be further limited by 0.3≤E3/D3<1. In addition, if the reflectivity of the raising segment 325 is represented by S3, then the relationship between R3 and S3 is satisfied by S3<R3. In an embodiment, the relationship between R3 and S3 can be further limited by 0.8≤S3/R3<1 to cause the juncture between the supporting segment 324 and the raising segment 325 to have a satisfactory structural strength and a satisfactory bending angle.

In the third embodiment, because the fixing element 240 is attached to the raising segment 325, the included angle $\theta_3$ between the raising segment 325 and the supporting segment 324 can be 90 degrees, such that the fixing element 240 can directly abut against an outer side of the raising segment 325 far away from the display panel 220 to enhance a fixing effect of the fixing element 240.

Figure 5:
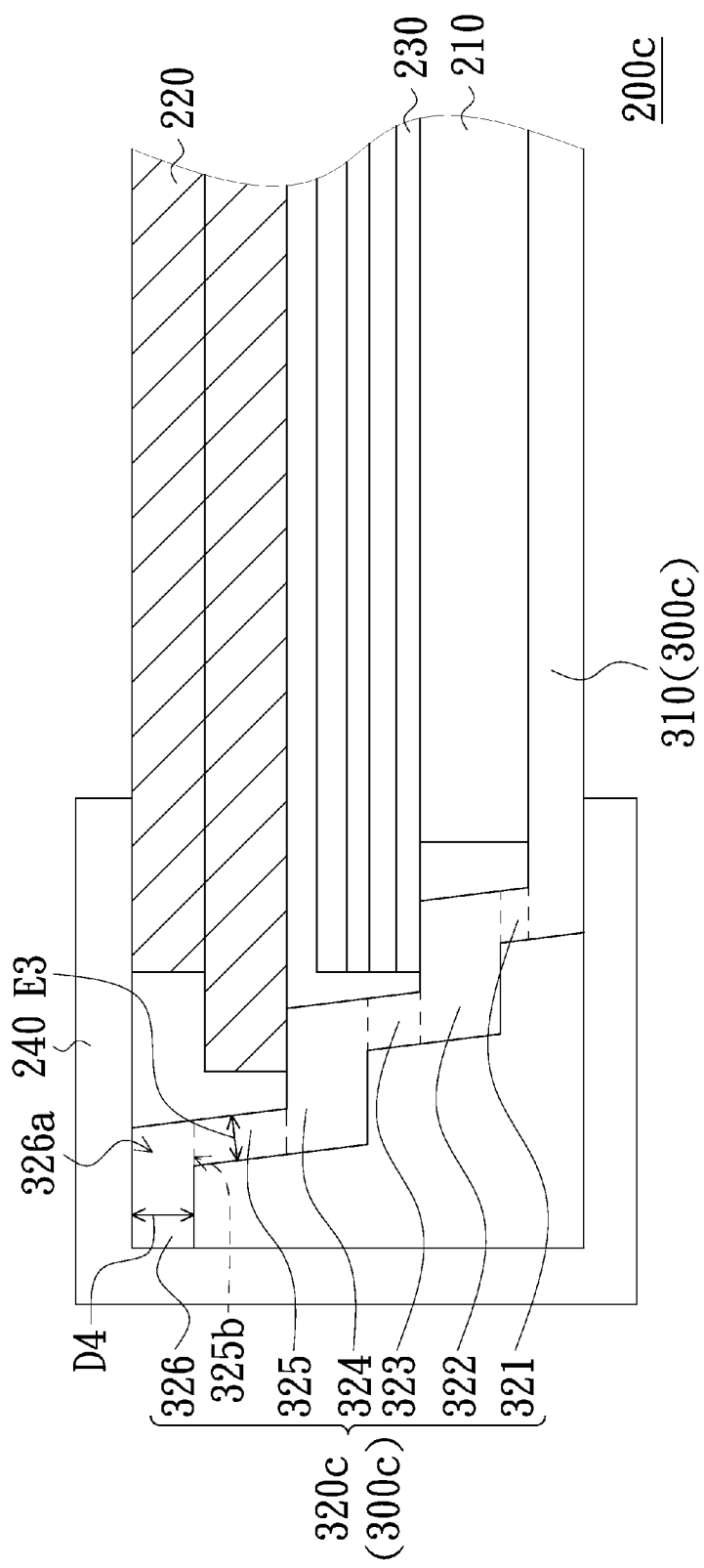
FIG. 5 is a schematic, partially cross-sectional view of a display device according to a fourth embodiment of the present invention.

FIG. 5 is a schematic, partially cross-sectional view of a display device 200c according to a fourth embodiment of the present invention. Referring to FIG. 5, the display device 200c is similar to the above-mentioned display device 200b, and for clarity, only the difference of the display device 200c over the display device 200b is described hereinafter. In contrast to the stepwise supporting structure 320b of FIG. 4, the stepwise supporting structure 320c of the supporting base 300c in FIG. 5 further includes a supporting segment 326. The supporting segment 326 is substantially parallel to the bottom plate 310 and extends outwards of the bottom plate 310 from a top end 325b of the raising segment 325. The supporting segment 326 has an inner end 326a connected to the top end 325b of the raising segment 325. The fixing element 240 is attached to the supporting segment 326. If a thickness of the supporting segment 326 is represented by D4, then the relationship between D4 and E3 is satisfied by E3<D4. In an embodiment, in order to cause a juncture of the supporting segment 326 and the raising segment 325 to have a satisfactory bending angle and a satisfactory structural strength, and to cause the supporting segment 326 to have a satisfactory flatness, the relationship between D4 and E3 can be further limited by 0.3≤E3/D4<1. In addition, if the reflectivity of the supporting segment 326 is represented by R4, then the relationship between R4 and S3 is satisfied by S3<R4. In an embodiment, the relationship between R4 and S3 can be further limited by 0.8≤S3/R4<1 to cause the juncture between the supporting segment 326 and the raising segment 325 to have a satisfactory structural strength and a satisfactory bending angle, and to cause the supporting segment 326 to have a satisfactory flatness.

In the illustrated embodiment of FIG. 4, the raising segment 325 is set perpendicular to the supporting segment 324 so as to enhance a fixing effect of the fixing element 240. However, in the illustrated embodiment of FIG. 5, the supporting segment 326 is provided to increase a contact surface area between the fixing element 240 and the stepwise supporting structure 320c, thereby enhancing a fixing effect of the fixing element 240. Therefore, in the embodiment of FIG. 5, a satisfactory fixing effect of the fixing element 240 can be obtained even if an included angle between the raising segment 325 and the supporting segment 324 is set at an angle other than 90 degrees.

It is pointed out that the supporting base of the present invention is not limited to be applied to the display device. Furthermore, the raising segment(s) or the supporting segment(s) in each stepwise supporting structure of the supporting base can be varied in number according to practical application requirements. For example, each stepwise supporting structure can include other supporting segment to support a touch panel of a touch display device or a parallax element of a stereoscopic display device when the supporting base is applied to the touch display device or the stereoscopic display device. The number of the raising segments depends on the number of the supporting segment(s). Moreover, some supporting segment(s) of at least one of the stepwise supporting structures has locating hole(s). The embodiment that the supporting segment has the locating hole will be described below with reference to FIG. 6.

Figure 6:
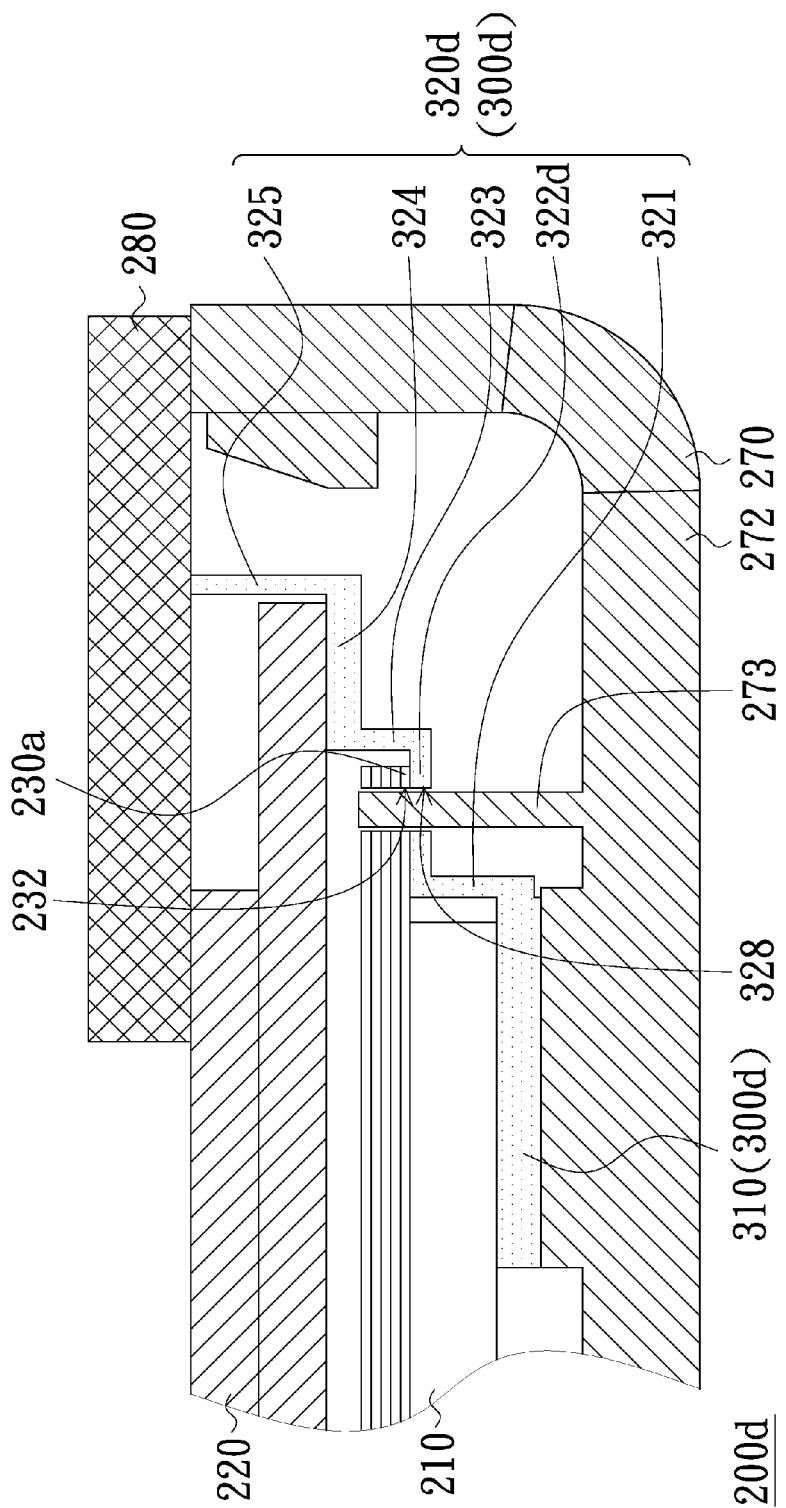
FIG. 6 is a schematic, partially cross-sectional view of a display device according to a fifth embodiment of the present invention.

FIG. 6 is a schematic, partially cross-sectional view of a display device 200d according to a fifth embodiment of the present invention. In contrast to the display device 200b of FIG. 4, the display device 200d of FIG. 6 further includes a bottom cover 270. The supporting base 300d is disposed on the bottom cover 270. The display device 200d can further includes a top cover 280 which can be suitably coupled to the bottom cover 270. The top and bottom covers 270, 280 can function as a casing for the display device 200d. When the display device 200b of FIG. 4 is applied to an electronic product such as a notebook computer or a tablet computer, the top and bottom covers 270, 280 can also function as a casing for the electronic product.

A bottom 272 of the bottom cover 270 has a locating post 273. The supporting segment 322d of at least one stepwise supporting structure 320d of the supporting base 300d is defined with a locating hole 328 corresponding to the locating post 273. The locating post 273 is inserted into the locating hole 328 to fix the supporting base 300d on the bottom cover 270. The locating post 273 can be only one or plural, and the number of locating hole 328 depends on the number of the locating post 273, although in FIG. 6, only one locating post 273 is shown. In addition, each optical film 230a disposed on the supporting segment 322d can be defined with a locating hole 232 corresponding to the locating post 273, such that the locating post 273 can be further inserted into the locating holes 232 to fix the optical films 230a.

Since the bottom cover 270 of the display device 200d is provided with the locating post 273 and the supporting segment 322d of at least one stepwise supporting structure 320d is provided with the locating hole 328 corresponding to the locating post 273, the supporting base 300d can be located on the bottom cover 270 conveniently to improve an assembling efficiency of the display device 200d.

It is pointed out that, although in the fifth embodiment the locating hole 328 is defined in the supporting segment 322d of the stepwise supporting structure 320d, the locating hole 328 is not limited to be defined in the supporting segment 322d. In other alternative embodiments, the locating hole 328 can be defined in the supporting segment 324, and the locating post 273 is provided to be in alignment with the locating hole 328. In addition, the display device 200d can further include the fixing element 240 of FIG. 4. The thickness of each of the supporting segments 322d, 324 can be no more than the thickness of each of the raising segments 321, 323, 325.

Figure 7:
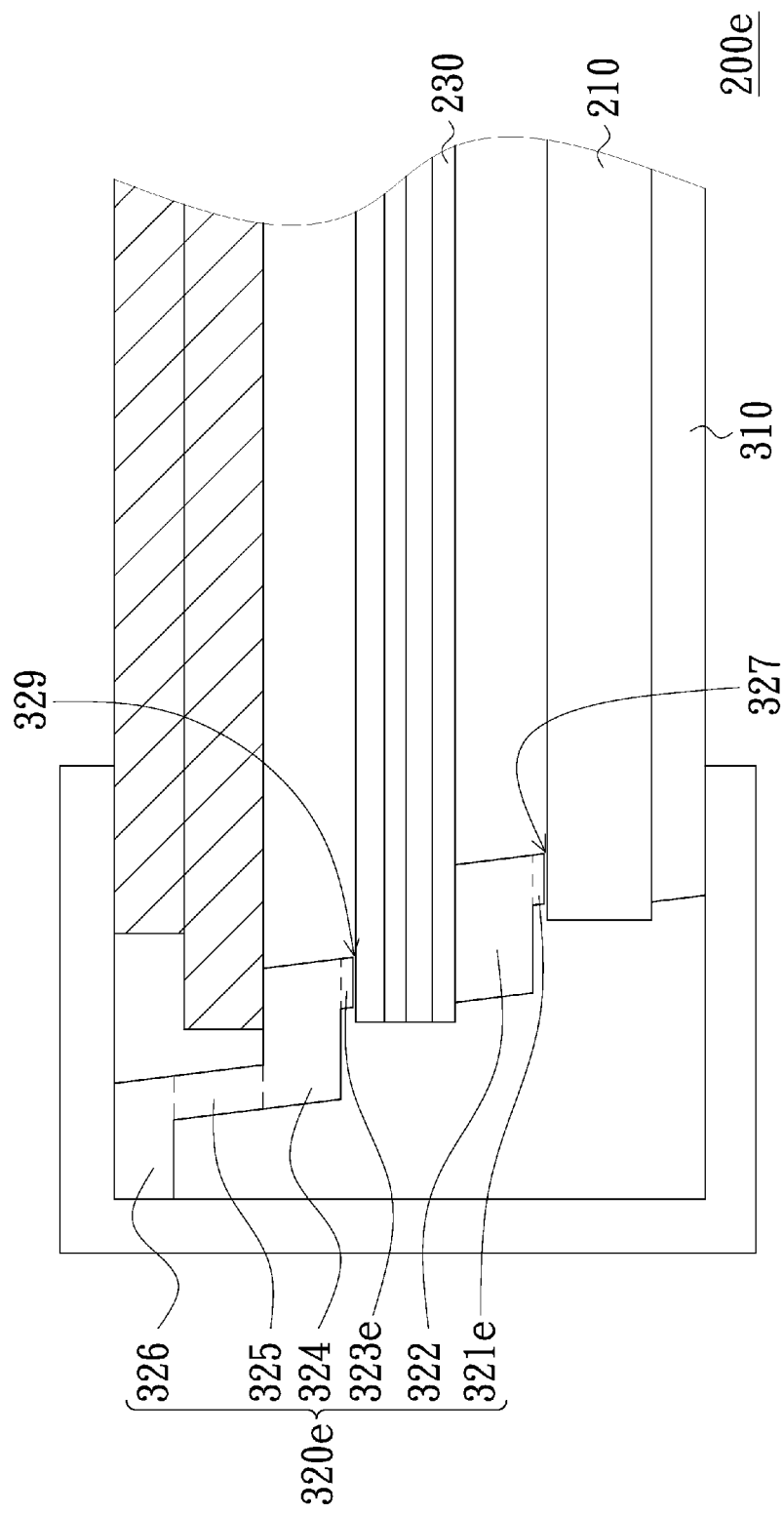
FIG. 7 is a schematic, partially cross-sectional view of a display device according to a sixth embodiment of the present invention.

FIG. 7 is a schematic, partially cross-sectional view of a display device 200e according to a sixth embodiment of the present invention. In contrast to the display device 200c of FIG. 5, the raising segment 321e of at least one stepwise supporting structure 320e of the display device 200e of FIG. 7 is defined with a groove 327, and the raising segment 323e of at least one stepwise supporting structure 320e is defined with a groove 329. The raising segment 323e is connected with the supporting segment 322. The light guide plate 210 is disposed on the bottom plate 310 and one lateral side of the light guide plate 210 is inserted into the groove 327. The optical films 230 are disposed on the supporting segment 322 and one lateral side of each optical film 230 is inserted into the groove 329. The presence of the grooves 327, 329 is beneficial in fixing the light guide plate 210 and the optical films 230. In addition, the thickness of each of the supporting segments 322, 324, 326 can be no more than the thickness of each of the raising segments 321e, 323e, 325.

In the above illustrated embodiments, the supporting base can carry the components of the backlight module and the display panel thereon. Thus, the supporting base can be used to replace for the back bezel and the inner frame as required by conventional display devices. Since the back bezel and the inner frame required by conventional display devices are replaced by the supporting base, the display device of the present invention is simplified with reduced components and an assembling efficiency thereof is accordingly improved. In addition, the supporting base can be made of a light reflective material such that a reflector is no longer required to be set between the light guide plate and the supporting base, thereby further improving an assembling efficiency of the display device and further reducing a manufacturing cost for the display device. Furthermore, in one embodiment, the bottom cover of the display device is provided with the locating post and the supporting segment of at least one stepwise supporting structure is provided with the locating hole corresponding to the locating post, such that the supporting base can be located on the bottom cover conveniently to improve an assembling efficiency of the display device. Moreover, in one embodiment, at least one stepwise supporting structure is defined with the grooves so that the light guide plate and the optical films can be inserted in the grooves, which is beneficial in fixing the light guide plate and the optical films on the supporting base.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A supporting base for a display device, the supporting base comprising:
    a bottom plate having a plurality of side edges; and
    a plurality of stepwise supporting structures respectively connected with the side edges and raised up from the bottom plate, each stepwise supporting structure comprising:
        a first raising segment having a bottom end connected with one of the side edges of the bottom plate;
        a first supporting segment being substantially parallel to the bottom plate and extending outwards of the bottom plate from a top end of the first raising segment, the first supporting segment having an inner end connected with the top end of the first raising segment;
        a second raising segment raised up from the first supporting segment and having a bottom end connected with an outer end of the first supporting segment far away from the first raising segment;
    wherein if a thickness of the bottom plate is represented by D1, a thickness of the first supporting segment is represented by D2, a thickness of the first raising segment is represented by E1, and a thickness of the second raising segment is represented by E2, then the relationship between D1, D2, E1 and E2 is limited by E1<D1, E1<D2, and E2<D2, wherein the bottom plate and the stepwise supporting structures are made of a light reflective material, a thickness of the light reflective material is in positive correlation to a reflectivity of the light reflective material, and the reflectivity of at least one of the at least one supporting segment is greater than the reflectivity of at least one of the plurality of raising segments.

2. The supporting base according to claim 1, wherein each stepwise supporting structure further comprises a second supporting segment, the second supporting segment is substantially parallel to the bottom plate and extends outwards of the bottom plate from a top end of the second raising segment, and the second supporting segment has an inner end connected with the top end of the second raising segment, if a thickness of the second supporting segment is represented by D3, then the relationship between D3 and E2 is limited by E2<D3.

3. The supporting base according to claim 2, wherein each stepwise supporting structure further comprises a third raising segment, the third raising segment is raised up from the second supporting segment, and the third raising segment has a bottom end connected with an outer end of the second supporting segment far away from the second raising segment, if a thickness of the third raising segment is represented by E3, then the relationship between D3 and E3 is limited by E3<D3.

4. The supporting base according to claim 3, wherein each stepwise supporting structure further comprises a third supporting segment, the third supporting segment is substantially parallel to the bottom plate and extends outwards of the bottom plate from a top end of the third raising segment, and the third supporting segment has an inner end connected with the top end of the third raising segment, if a thickness of the third supporting segment is represented by D4, then the relationship between D4 and E3 is limited by E3<D4.

5. The supporting base according to claim 4, wherein the relationship between D1, D2, D3, D4, E1, E2 and E3 is limited by $0.3 \leq E1/D1 < 1$, $0.3 \leq E1/D2 < 1$, $0.3 \leq E2/D2 < 1$, $0.3 \leq E2/D3 < 1$, $0.3 \leq E3/D3 < 1$, and $0.3 \leq E3/D4 < 1$.

6. The supporting base according to claim 1, wherein the bottom plate and the stepwise supporting structures are made by processing a white foamed polyethylene terephthalate sheet.

7. A display device comprising:
a supporting base comprising:
a bottom plate having a plurality of side edges; and
a plurality of stepwise supporting structures respectively connected with the side edges and raised up from the bottom plate, each stepwise supporting structure comprising a first raising segment, a first supporting segment, and a second raising segment, the first raising segment having a bottom end connected with one of the side edges of the bottom plate, the first supporting segment being substantially parallel to the bottom plate and extending outwards of the bottom plate from a top end of the first raising segment, the first supporting segment having an inner end connected with the top end of the first raising segment, the second raising segment being raised up from the first supporting segment and having a bottom end connected with an outer end of the supporting segment far away from the first raising segment, wherein if a thickness of the bottom plate is represented by D1, a thickness of the first supporting segment is represented by D2, a thickness of the first raising segment is represented by E1, and a thickness of the second raising segment is represented by E2, then the relationship between D1, D2, E1 and E2 is limited by $E1 < D1$, $E1 < D2$, and $E2 < D2$, wherein the bottom plate and the stepwise supporting structures are made of a light reflective material, a thickness of the light reflective material is in positive correlation to a reflectivity of the light reflective material, and the reflectivity of at least one of the at least one supporting segment is greater than the reflectivity of at least one of the plurality of raising segments;
a light guide plate disposed on the bottom plate; and
a display panel disposed above the light guide plate.

8. The display device according to claim 7, further comprising a bottom cover, wherein the supporting base is disposed on the bottom cover, a bottom end of the bottom cover has at least one locating post, the first supporting segment of at least one of the stepwise supporting structures is defined with at least one locating hole corresponding to the at least one locating post, the at least one locating post is inserted into the at least one locating hole.

9. The display device according to claim 7, wherein at least one of the first raising segments of the stepwise supporting structures is defined with a groove, the light guide plate is inserted into the groove.

10. The display device according to claim 7, wherein each stepwise supporting structure further comprises a second supporting segment, the second supporting segment is substantially parallel to the bottom plate and extends outwards of the bottom plate from a top end of the second raising segment, and the second supporting segment has an inner end connected with the top end of the second raising segment, if a thickness of the second supporting segment is represented by D3, then the relationship between D3 and E2 is limited by $E2 < D3$, the display device further comprises a plurality of optical films and a fixing element, the optical films are disposed on the light guide plate, the display panel is disposed on the first supporting segments of the stepwise supporting structures, the fixing element wraps a peripheral region of the display panel, an outer side of each stepwise supporting structure far away from the display panel and a peripheral region of the bottom plate, and the fixing element is connected to the second supporting segment.

11. The display device according to claim 7, wherein each stepwise supporting structure further comprises a second supporting segment and a third raising segment, the second supporting segment is substantially parallel to the bottom plate and extends outwards of the bottom plate from a top end of the second raising segment, and the second supporting segment has an inner end connected with the top end of the second raising segment, if a thickness of the second supporting segment is represented by D3, then the relationship between D3 and E2 is limited by $E2 < D3$, the third raising segment is raised up from the second supporting segment, and the third raising segment has a bottom end connected with an outer end of the second supporting segment, if a thickness of the third raising segment is represented by E3, then the relationship between D3 and E3 is limited by $E3 < D3$, the display panel is disposed on the second supporting segments of the stepwise supporting structures, the display device further comprises a plurality of optical films and a fixing element, the optical films are disposed on the first supporting segments of the stepwise supporting structures, the fixing element wraps a peripheral region of the display panel, an outer side of each stepwise supporting structure far away from the display panel and a peripheral region of the bottom plate, and the fixing element is connected to the third raising segment.

12. The display device according to claim 7, wherein each stepwise supporting structure further comprises a second supporting segment, the second supporting segment is connected with a top end of the second raising segment, the display device further comprises a plurality of optical films and a bottom cover, the optical films are disposed on the first supporting segments of the stepwise supporting structures, the supporting base is disposed on the bottom cover, a bottom of the bottom cover has at least one locating post, the first supporting segment of at least one of the stepwise supporting structures is defined with at least one first locating hole corresponding to the at least one locating post, each optical film is defined with at least one second locating hole corresponding to the at least one locating post, and the at least one locating post is inserted into the at least one first locating hole and the at least one second locating hole.

13. The display device according to claim 7, wherein each stepwise supporting structure further comprises a second supporting segment, the second supporting segment is connected with a top end of the second raising segment, at least one of the second supporting segments of the stepwise supporting structures is defined with a groove, the display device further comprises a plurality of optical films, the optical films are disposed on the first supporting segments of the stepwise supporting structures and inserted into the groove.

14. The display device according to claim 7, wherein each stepwise supporting structure further comprises a second supporting segment, a third raising segment and a third supporting segment, the second supporting segment is substantially parallel to the bottom plate and extends outwards of the bottom plate from a top end of the second raising segment, the second supporting segment has an inner end connected with the top end of the second raising segment, if a thickness of the second supporting segment is represented by D3, then the relationship between D3 and E2 is limited by E2<D3, the third raising segment is raised up from the second supporting segment, and the third raising segment has a bottom end connected with an outer end of the second supporting segment, if a thickness of the third raising segment is represented by E3, then the relationship between D3 and E3 is limited by E3<D3, the third supporting segment is substantially parallel to the bottom plate and extends outwards of the bottom plate from a top end of the third raising segment, and the third supporting segment has an inner end connected with the top end of the third raising segment, if a thickness of the third supporting segment is represented by D4, then the relationship between D4 and E3 is limited by E3<D4, the display panel is disposed on the second supporting segments of the stepwise supporting structures, the display device further comprises a plurality of optical films and a fixing element, the optical films are disposed on the first supporting segments of the stepwise supporting structures, the fixing element wraps a peripheral region of the display panel, an outer side of each stepwise supporting structure far away from the display panel and a peripheral region of the bottom plate, and the fixing element is connected to the third supporting segment.

15. The display device according to claim 7, wherein the bottom plate and the stepwise supporting structures are made by processing a white foamed polyethylene terephthalate sheet.

16. A supporting base for a display device, the supporting base comprising:
a bottom plate having a plurality of side edges; and
a plurality of stepwise supporting structures connected with the side edges and raised up from the bottom plate, each stepwise supporting structure comprising a first raising segment, a first supporting segment, and a second raising segment, the first raising segment having a bottom end connected with one of the side edges of the bottom plate, the first supporting segment being substantially parallel to the bottom plate and extending outwards of the bottom plate from a top end of the first raising segment, the first supporting segment has an inner end connected with the top end of the first raising segment, the second raising segment being raised up from the first supporting segment and having a bottom end connected with an outer end of the first supporting segment far away from the first raising segment;
wherein the bottom plate and the stepwise supporting structures are made of a light reflective material, a thickness of the light reflective material is in positive correlation to a reflectivity of the light reflective material, and the reflectivity of at least one of the at least one supporting segment is greater than the reflectivity of at least one of the plurality of raising segments;
wherein if the reflectivity of the bottom plate is represented by R1, the reflectivity of the first supporting segment is represented by R2, the reflectivity of the first raising segment is represented by S1 and the reflectivity of the second raising segment is represented by S2, then the relationship between R1, R2, S1 and S2 is limited by S1<R1, S1<R2, and S2<R2.

17. The supporting base according to claim 16, wherein each stepwise supporting structure further comprises a second supporting segment, the second supporting segment is substantially parallel to the bottom plate and extends outwards of the bottom plate from a top end of the second raising segment, and the second supporting segment has an inner end connected with the top end of the second raising segment, if the reflectivity of the second supporting segment is represented by R3, then the relationship between R3 and S2 is limited by S2<R3.

18. The supporting base according to claim 17, wherein each stepwise supporting structure further comprises a third raising segment, the third raising segment is raised up from the second supporting segment, and the third raising segment has a bottom end connected with an outer end of the second supporting segment far away from the second raising segment, if the reflectivity of the third raising segment is represented by S3, then the relationship between R3 and S3 is limited by S3<R3.

19. The supporting base according to claim 18, wherein each stepwise supporting structure further comprises a third supporting segment, the third supporting segment is substantially parallel to the bottom plate and extends outwards of the bottom plate from a top end of the third raising segment, and the third supporting segment has an inner end connected with the top end of the third raising segment, if the reflectivity of the third supporting segment is represented by R4, then the relationship between R4 and S3 is limited by S3<R4.

20. The supporting base according to claim 19, wherein the relationship between R1, R2, R3, R4, S1, S2 and S3 is limited by $0.8 \leq S1/R1 < 1$, $0.8 \leq S1/R2 < 1$, $0.8 \leq S2/R2 < 1$, $0.8 \leq S2/R3 < 1$, $0.8 \leq S3/R3 < 1$, and $0.8 \leq S3/R4 < 1$.

21. The supporting base according to claim 16, wherein the bottom plate and the stepwise supporting structures are made by processing a white foamed polyethylene terephthalate sheet.

* * * * *